United States Patent
Li et al.

(10) Patent No.: US 8,232,148 B2
(45) Date of Patent: Jul. 31, 2012

(54) STRUCTURE AND METHOD TO MAKE REPLACEMENT METAL GATE AND CONTACT METAL

(75) Inventors: Zhengwen Li, Hopewell Junction, NY (US); Michael P. Chudzik, Hopewell Junction, NY (US); Unoh Kwon, Hopewell Junction, NY (US); Filippos Papadatos, Hopewell Junction, NY (US); Andrew H. Simon, Hopewell Junction, NY (US); Keith Kwong Hon Wong, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 12/717,398

(22) Filed: Mar. 4, 2010

(65) Prior Publication Data

US 2011/0215409 A1  Sep. 8, 2011

(51) Int. Cl.
   *H01L 21/00* (2006.01)
(52) U.S. Cl. ........ 438/154; 257/351
(58) Field of Classification Search .......... 257/351; 438/154
   See application file for complete search history.

(56) References Cited

U.S. PATENT DOCUMENTS

| | | | |
|---|---|---|---|
| 6,852,577 B2 * | 2/2005 | Chen | 438/163 |
| 6,864,145 B2 | 3/2005 | Hareland et al. | |
| 7,595,248 B2 | 9/2009 | Hattendorf et al. | |
| 2004/0175910 A1 | 9/2004 | Pan et al. | |
| 2004/0214416 A1 | 10/2004 | Woo et al. | |
| 2009/0057772 A1 | 3/2009 | Bohr | |
| 2009/0087974 A1 * | 4/2009 | Waite et al. | 438/592 |

OTHER PUBLICATIONS

International Search Report/Written Opiinion, Nov. 28, 2011.

* cited by examiner

*Primary Examiner* — Matthew Landau
*Assistant Examiner* — Robert Bachner
(74) *Attorney, Agent, or Firm* — Scully, Scott, Murphy & Presser, P.C.; H. Daniel Schnurmann

(57) ABSTRACT

An electrical device is provided with a p-type semiconductor device having a first gate structure that includes a gate dielectric on top of a semiconductor substrate, a p-type work function metal layer, a metal layer composed of titanium and aluminum, and a metal fill composed of aluminum. An n-type semiconductor device is also present on the semiconductor substrate that includes a second gate structure that includes a gate dielectric, a metal layer composed of titanium and aluminum, and a metal fill composed of aluminum. An interlevel dielectric is present over the semiconductor substrate. The interlevel dielectric includes interconnects to the source and drain regions of the p-type and n-type semiconductor devices. The interconnects are composed of a metal layer composed of titanium and aluminum, and a metal fill composed of aluminum. The present disclosure also provides a method of forming the aforementioned structure.

12 Claims, 4 Drawing Sheets

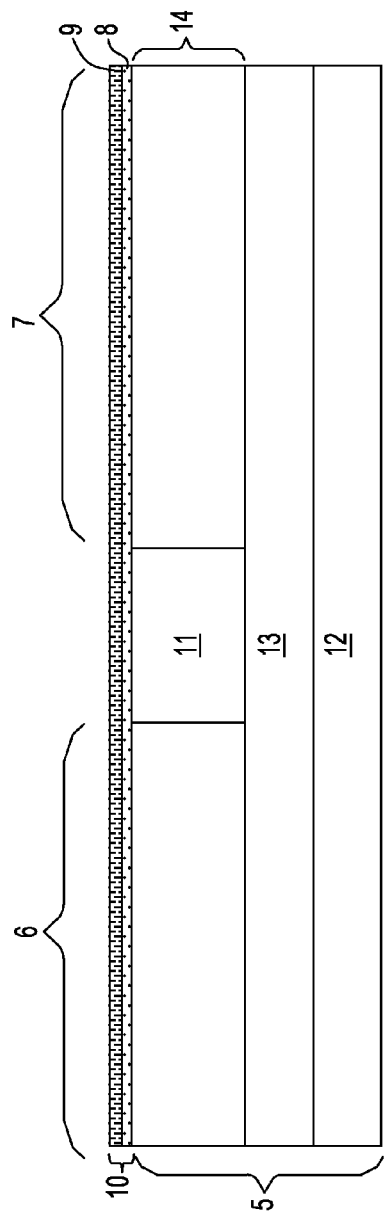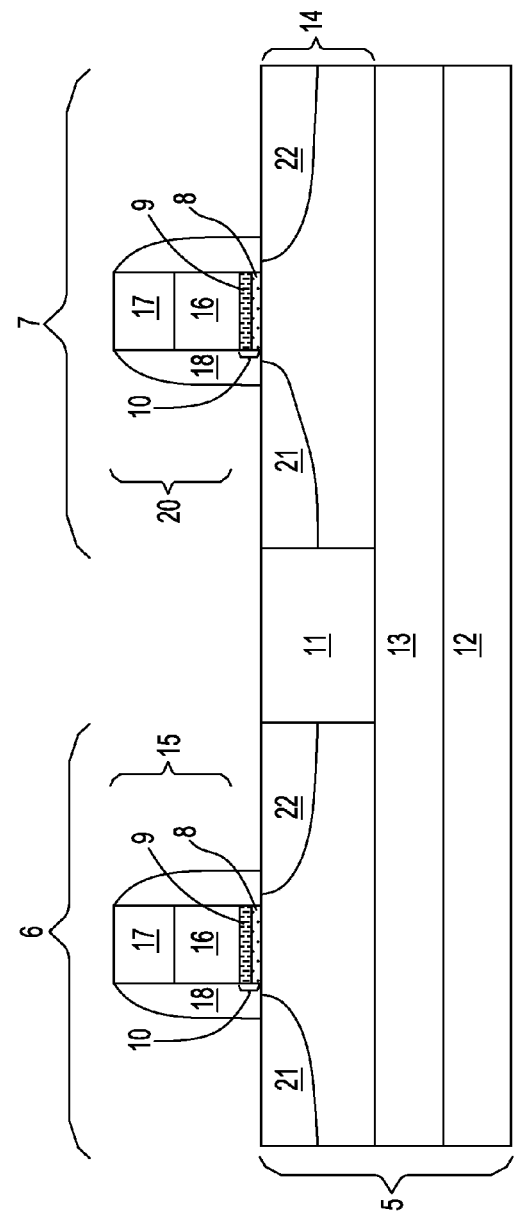

STRUCTURE AND METHOD TO MAKE REPLACEMENT METAL GATE AND CONTACT METAL

BACKGROUND

The present disclosure relates to semiconductor devices. More particularly, the present disclosure relates to forming gate structures and interconnects to semiconductor devices.

Field effect transistors (FETs) are the basic building block of today's integrated circuits (ICs). Such transistors can be formed in conventional bulk semiconductor substrates (such as silicon) or in a SOI layer of a semiconductor-on-insulator (SOI) substrate. In order to be able to make ICs, such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device, while maintaining the device's electrical properties.

SUMMARY

The present disclosure provides a method for forming a semiconductor device that includes forming a first sacrificial stack and a second sacrificial stack on a semiconductor substrate. The first sacrificial stack and the second sacrificial stack each include a gate dielectric layer. The first sacrificial stack is present in a first device region of the semiconductor substrate between an n-type source region and an n-type drain region, and the second sacrificial stack is present in a second device region of the semiconductor substrate between a p-type source region and a p-type drain region. An interlevel dielectric is formed having an upper surface that is coplanar with an upper surface of the first sacrificial stack and the second sacrificial stack. A portion of the first sacrificial stack and the second sacrificial stack is then removed to expose the gate dielectric layer.

A p-type work function metal layer is formed on the gate dielectric layer. A via is formed to each of the n-type source region, the n-type drain region, the p-type source region and the p-type drain region. The p-type work function metal layer is removed from the first device region, wherein the p-type work function metal layer remains in the second device region. Forming a metal layer comprising titanium and aluminum is then formed on the gate dielectric layer in the first device region, the n-type source region, the n-type drain region, the p-type work function metal layer in the second device region, the p-type source region and the p-type drain region. A metal fill comprising aluminum is formed on the metal layer comprising titanium and aluminum.

In another aspect, an electrical device is provided that includes an n-type semiconductor device having a first gate structure in a first device region of a semiconductor substrate that is between a first source region and a first drain region. The first gate structure includes a gate dielectric that is present on the substrate, a metal layer comprising titanium and aluminum, and a metal fill comprised of aluminum. The electrical device also includes a p-type semiconductor device including a second gate structure in a second device region of a semiconductor substrate that is between a second source region and a second drain region. The second gate structure includes a gate dielectric that is present on the substrate, a p-type work function adjustment metal layer, a metal layer comprising titanium and aluminum, and a metal fill comprised of aluminum. The electrical device also includes an interlevel dielectric that is present over the substrate. The interlevel dielectric comprises interconnects to the first source region, the first drain region, the second source region and the second drain region. The interconnects are comprised of a metal layer comprising titanium and aluminum, and a metal fill comprised of aluminum.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1 is a side cross-sectional view depicting forming a gate dielectric layer on a semiconductor substrate, in which the gate dielectric layer is composed of a high-k dielectric layer and a metal nitride gate dielectric layer, in accordance with one embodiment of the present invention.

FIG. 2 is a side cross-sectional view depicting forming a first sacrificial stack and a second sacrificial stack on a semiconductor substrate, in accordance with one embodiment of the present invention.

DETAILED DESCRIPTION OF THE INVENTION

Figure 3:
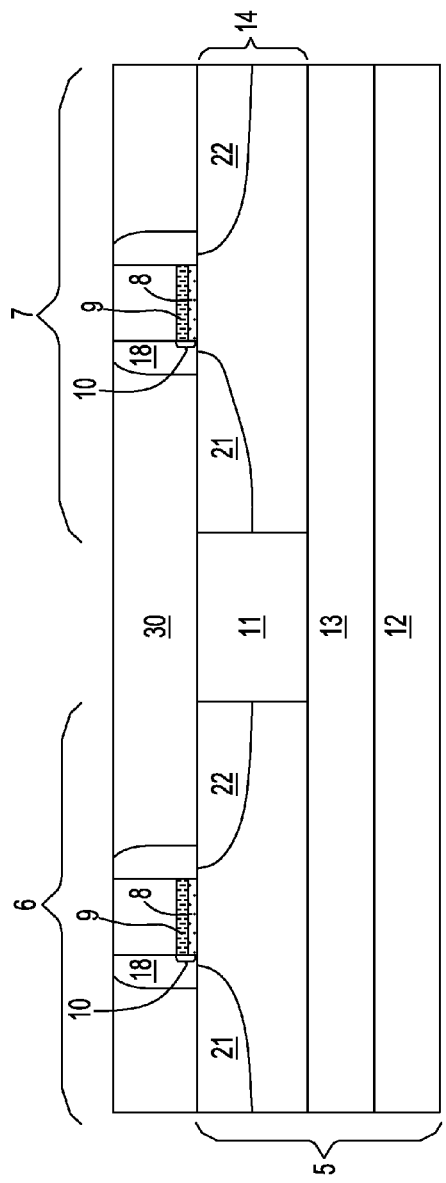
FIG. 3 is a side cross-sectional view depicting forming an interlevel dielectric having an upper surface that is coplanar with an upper surface of the first sacrificial stack and the second sacrificial stack, in accordance with one embodiment of the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present disclosure relates to structures and methods for forming complementary metal oxide semiconductor (CMOS) devices, in which the gate structures to the semiconductor devices and the contacts to the source and drain regions of the semiconductor devices include a metal layer composed of titanium and aluminum and a metal fill composed of aluminum. In one embodiment, the metal layer that is composed of titanium and aluminum is present in the gate structure of an n-type semiconductor device and provides a work function that results in a threshold voltage shift of the n-type semiconductor device. The p-type semiconductor device may further include a p-type work function metal.

Reference is first made to FIG. 1, which depicts forming a gate dielectric layer 10 on a semiconductor substrate 5. In one embodiment, the semiconductor substrate 5 comprises a semiconductor-on-insulator substrate (SOI) which includes a bottom semiconductor-containing layer 12, a buried insulating layer 13 present atop the bottom semiconductor-containing layer 12, and top semiconductor-containing layer (i.e., SOI layer) 14 present atop the surface of the buried insulating layer 13. In one embodiment, the bottom and top semiconductor-containing layers 12, 14 are composed of a Si-containing material.

The term "Si-containing material" as used herein denotes any semiconductor material that includes silicon. Illustrative examples of various Si semiconductor materials that can be employed in the present invention include, but are not limited to: Si, SiGe, SiGeC, SiC and other like Si-containing materials. Combinations of the aforementioned semiconductor materials can also be used as the Si-containing layers of the SOI substrate.

The top semiconductor-containing layer (hereinafter referred to as the SOI layer) 14 may have a thickness ranging from 20.0 nm to 70.0 nm. The buried insulating layer 13 is typically a buried oxide region, which may have a thickness ranging from 150.0 nm to 200.0 nm. The thickness of the bottom semiconductor-containing layer 12 typically ranges from ranging from 150.0 nm to 200.0 nm.

The semiconductor substrate 5 shown in FIG. 1 may be formed by a thermal bonding process, or by an oxygen implantation process, which is referred to in the art as a separation by implantation of oxygen (SIMOX). In another embodiment, the semiconductor substrate 5 that is depicted in FIG. 1 may be a bulk semiconductor-containing substrate, such as bulk silicon.

An isolation region 11 may be formed in the semiconductor substrate 5, which may provide the boundary between a first device region 6 and a second device region 7. In one embodiment, the first device region 6 provides the site for a subsequently formed p-type semiconductor device, and the second device region 7 provides the site for a subsequently formed n-type semiconductor device. The term "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor. As used herein, "p-type semiconductor" refers to the addition of trivalent impurities to a semiconductor material that create deficiencies of valence electrons, such as boron, aluminum or gallium to an intrinsic silicon substrate. As used herein, "n-type semiconductor" refers to the addition of pentavalent impurities to a semiconductor substrate that contribute free electrons, such as antimony, arsenic or phosphorous to an intrinsic Si substrate.

The isolation region 11 may be a shallow trench isolation (STI) region formed by etching a trench into at least the SOI layer of the substrate 5. In some embodiments, and as shown, the trench has a bottom surface that contacts an upper surface of the buried insulating layer 13. The etching step may be performed utilizing a dry etching process, such as reactive-ion etching, ion beam etching, laser ablation or any combination thereof. Chemical vapor deposition (CVD) or another like deposition process can be used to fill the trench with an STI dielectric material, such as a high-density plasma (HDP) oxide or TEOS (tetraethylorthosilicate). The isolation region 11 may also be formed by local oxidation (LOCOS) or by an oxide mesa formation process.

The gate dielectric layer 10 shown in FIG. 1 is formed on the semiconductor substrate 5. The gate dielectric layer 10 may be composed of any dielectric including, but not limited to: $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides. In one embodiment, the gate dielectric layer 10 may be formed by a thermal growth process such as, for example, oxidation, nitridation or oxynitridation. The gate dielectric layer 10 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes.

In one embodiment, the gate dielectric layer 10 is a multi-layered structure that is composed of a high-k dielectric layer 8 and a metal nitride gate dielectric 9. The high-k dielectric layer 8 may be formed by a thermal growth process such as, for example, oxidation, nitridation or oxynitridation. The high-k dielectric layer 8 may also be formed by a deposition process such as, for example, chemical vapor deposition (CVD). Chemical Vapor Deposition (CVD) is a deposition process in which a deposited species is formed as a results of chemical reaction between gaseous reactants at an elevated temperature (typically being greater than 600° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and others.

The high-k dielectric layer 8 may be composed of an oxide, a nitride, an oxynitride or combinations and multi-layers thereof. A high-k dielectric is a material having a dielectric constant that is greater than the dielectric constant of silicon oxide. In one embodiment, the high-k dielectric layer 8 is comprised of a high-k dielectric material having a dielectric constant greater than about 4.0, e.g., 4.1. In another embodiment, the high-k dielectric layer 8 is comprised of a high-k dielectric material having a dielectric constant greater than 7.0. In yet another embodiment, the high-k dielectric layer 8 is comprised of a high-k dielectric material having a dielectric constant ranging from greater than 4.0 to 30. The dielectric constants mentioned herein are relative to a vacuum.

Some examples of high-k dielectric materials suitable for the high-k dielectric layer 8 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the high-k dielectric layer 8 has a thickness ranging from 1.0 nm to 10.0 nm. In another example, the high-k dielectric layer 8 may have a thickness ranging from 2.5 nm to 5.0 nm. In one embodiment, the high-k dielectric layer 8 is hafnium oxide ($HfO_2$).

The metal nitride gate dielectric 9 is formed in direct contact with an upper surface of the high-k dielectric layer 8, and in some embodiments protects the high-k dielectric layer 8 from being damaged during later process steps. In one embodiment, the metal nitride gate dielectric 9 is composed of WN, WSiN, TiN, TiSiN, TaN, TaSiN, TiTaN, TaRuN or combinations thereof. The metal nitride gate dielectric 9 can be deposited using chemical vapor deposition (CVD), sputtering or plating. In one embodiment, the metal nitride gate dielectric 9 is composed of TiN and is deposited using sputtering. In one example, a metal nitride gate dielectric 9 composed of TiN is sputtered from a solid titanium target, in which the nitrogen content of the metal nitride layer is introduced by a nitrogen gas. In another example, a metal nitride gate dielectric 9 composed of TiN is sputtered from a solid target comprised of titanium and nitrogen. The metal nitride gate dielectric 9 typically has a thickness ranging from 1 nm to 10 nm, with a thickness ranging from 2.5 nm to 5 nm being more typical.

FIG. 2 depicts forming a first sacrificial stack 15 and a second sacrificial stack 20 on the semiconductor substrate 5. The first and second sacrificial stacks 15, 20 may be formed by first blanket depositing a layer of semiconductor-containing material 16 atop the metal nitride gate dielectric 9. The semiconductor-containing material 16 is typically a silicon-containing material, but any semiconductor is suitable for the material being deposited atop the metal nitride gate dielectric 9. Further, other non-semiconductor materials have been contemplated as a place keeping material for the first sacrificial stack 15 and the second sacrificial stack 20, so long as the non-semiconductor material may be removed selectively to the underlying gate dielectric layer 10. In one embodiment, the semiconductor-containing material 16 may be polysilicon.

The semiconductor-containing material 16 may be formed using a deposition process, including but not limited to: low pressure chemical vapor deposition or room temperature chemical vapor deposition. The semiconductor-containing material 16 may have a thickness ranging from 80.0 nm to 200.0 nm. In another embodiment, the semiconductor-containing material 16 may have a thickness ranging from 100.0 nm to 175.0 nm.

A hard mask dielectric layer 17 may then be formed on an upper surface of the semiconductor-containing material 16. The hard mask dielectric layer 17 may be composed of a nitride, oxide or oxynitride material. The hard mask dielectric layer 17 may be deposited by chemical vapor deposition (CVD). Variations of CVD processes suitable for depositing the hard mask dielectric layer 17 include, but are not limited to, Atmospheric Pressure CVD (APCVD), Low Pressure CVD (LPCVD) and Plasma Enhanced CVD (EPCVD), Metal-Organic CVD (MOCVD) and combinations thereof.

The first sacrificial stack 15 and the second sacrificial stack 20 are then formed from the deposited layers of hard mask dielectric layer 17 and the semiconductor-containing layer 16 using photolithography and etching. More specifically, a pattern is produced by applying a photoresist to the surface to be etched, exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. The term "selective" in reference to a material removal process denotes that the rate of material removal for a first material is greater than the rate of removal for at least another material of the structure to which the material removal process is being applied. The patterned resist is then removed using an $O_2$ ash process, or the patterned resist may be stripped using a wet chemical process.

Still referring to FIG. 2, at least one spacer 18 may be formed on the sidewall of each of the first and second sacrificial stacks 15, 20 using deposition and etch processes. In one embodiment, the at least one spacer 18 has a width measured at the base of the at least one spacer 18 ranging from 3 nm to 40 nm. In another embodiment, the at least one spacer 18 has a width measured at the base of the at least one spacer 18 ranging from 5.0 nm to 20.0 nm. The at least one spacer's 18 width may taper, i.e., may reduce, in the direction from the semiconductor substrate 5 towards the upper surface of the first sacrificial stack 15 and the second sacrificial stack 20.

The at least one spacer 18 may be comprised of a dielectric material, such as a nitride, e.g., silicon nitride. In one embodiment, the at least one spacer 18 may be comprised of a low-k dielectric material, which typically has a dielectric constant that is less than 4.0, e.g., 3.9. In one embodiment, the at least one spacer 18 is comprised of a low-k dielectric material having a dielectric constant ranging from 1.75 to 3.5. Examples of materials suitable for low-k dielectric spacers include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

Following the formation of the at least one spacer 18, source regions 21 and drain regions 22 are formed in the upper semiconductor-containing layer 14. A drain region 22 is the doped region in semiconductor device that is located at the end of the channel, in which carriers are flowing out of the transistor. The source region 21 is the doped region in the semiconductor device, in which majority carriers are flowing into the channel. The channel is the region underlying the subsequently formed gate structure and between the source region 21 and the drain region 22 of a semiconductor device that becomes conductive when the semiconductor device is turned on. In one embodiment, the source and drain regions 21, 22 of the semiconductor device include extension source and drain regions, deep source and drain regions (not shown), and halo regions (not shown).

Still referring to FIG. 2, source and drain regions 21, 22 are formed using an ion implantation process. P-type source extension regions for a p-type semiconductor device are typically produced with group III-A elements and n-type source extension regions for an n-type semiconductor device are typically produced with group V elements. In the case of the p-type implants, a typical impurity species is boron or $BF_2$. Boron with an energy of 0.2 keV to 3.0 keV or $BF_2$ with an energy of 1.0 keV to 15.0 keV and a dose of $5\times10^{13}$ atoms/$cm^2$ to about $3\times10^{16}$ atoms/$cm^2$ can be used to implant the p-type region. A typical implant for the n-type regions is arsenic. The n-type regions can be implanted with arsenic using an energy of 0.5 keV to 5.0 keV with a dose of $3\times10^{13}$ atoms/$cm^2$ to $3\times10^{16}$ atoms/$cm^2$. Deep source and drain regions are typically the same conductivity as their corresponding source and drain extensions regions, but typically have a greater dopant concentration and are implanted with a higher energy. Halo regions are typically formed using an angled implant and have an opposite conductivity as their corresponding source and drain extensions regions.

Although not depicted in the supplied figures, tensile strain inducing wells may be formed within the source and drain regions 21, 22 of the nFET devices, and compressive strain inducing wells may be formed within the source and drain regions 21, 22 of the pFET devices. In a first process step, a recess is formed within the portion of the upper semiconductor-containing layer 14, in which the source and drain regions 21, 22 are positioned. The recess may be formed using photolithography and etching.

Tensile strain inducing wells may be provided by silicon that is doped with carbon (Si:C), which may be epitaxially grown atop the recessed surface of the upper semiconductor-containing layer 14 that is overlying the source and drain regions 21, 22 having n-type conductivity within the second device region 7. The epitaxially grown Si:C is under an internal tensile strain (also referred to as an intrinsic tensile strain), in which the tensile strain is produced by a lattice mismatch between the smaller lattice dimension of the epitaxially grown Si:C, and the larger lattice dimension of the recessed surface of the upper semiconductor-containing layer 14 on which the Si:C is epitaxially grown, such as silicon. The internal tensile stress produced by the lattice mismatch may be induced upon the channel region of the subsequently formed n-type semiconductor device to produce a strain induced performance enhancement.

Compressive strain inducing wells may be positioned within the source and drain regions 21, 22 having the p-type conductivity. The compressive strain inducing wells may be composed of intrinsically compressive SiGe that has been epitaxially grown atop the recessed surface of the upper semiconductor-containing layer 14. The compressive strain inducing wells produce a compressive strain within the device channel of the subsequently formed p-type semiconductor device. The compressive strain is produced by a lattice mismatch between the larger lattice dimension of the epitaxially grown SiGe, and the smaller lattice dimension of the recessed surface of the upper semiconductor-containing layer 14 on which the SiGe is epitaxially grown, such as silicon.

In one embodiment, the tensile strain inducing wells and the compressive strain inducing wells encroach underneath the at least one sidewall spacer 18 that abuts the first and second sacrificial stack 15, 20. By positioning the tensile and compressive strain inducing wells closer to the device channel, the strain produced along the device channel is increased.

Silicide regions (not shown) may be formed atop the source and drain regions 21, 22. Silicide formation typically requires depositing a metal layer onto the surface of a Si-containing material or wafer. The metal layer may be deposited by at least one of chemical vapor deposition (CVD), plasma-assisted CVD, high-density chemical vapor deposition (HD-CVD), plating, sputtering, evaporation and chemical solution deposition. Metals deposited for silicide formation include Ta, Ti, W, Pt, Co, Ni, and combinations thereof. Following deposition, the structure is then subjected to an annealing step, which may include rapid thermal annealing. During annealing, the deposited metal reacts with Si forming a metal silicide.

An interlevel dielectric layer 30 can be deposited atop the entire semiconductor substrate 5 and planarized by chemical mechanical polishing (CMP) or like process until the top surface of the first and second sacrificial stack 15, 20 is exposed. The interlevel dielectric layer 30 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer 30 include: any of the aforementioned materials in porous form, or in a form that changes during processing to or from being porous and/or permeable to being non-porous and/or non-permeable. The blanket layer of the interlevel dielectric layer 30 may be formed by deposition processes, including, but not limited to spinning from solution, spraying from solution, chemical vapor deposition (CVD), plasma enhanced CVD (PECVD), sputter deposition, reactive sputter deposition, ion-beam deposition, and evaporation.

The blanket deposited interlevel dielectric layer 30 is then planarized until the upper surface of the first sacrificial stack 15 and the second sacrificial stack 20 is exposed, wherein the upper surface of the first and second sacrificial stack 15, 20 is coplanar with an upper surface of the interlevel dielectric layer 30. Planarization is a material removal process that employs at least mechanical forces, such as frictional media, to produce a planar surface. One example of planarization is chemical mechanical planarization (CMP). Chemical mechanical planarization (CMP) is a material removal process using both chemical reactions and mechanical forces to remove material and planarize a surface. Referring to FIG. 3, in one embodiment, the interlevel dielectric layer 30 is planarized until the hard mask dielectric layer 17 of the first and second sacrificial stack 15, 20 has been removed, and the upper surface of the semiconductor-containing material 16 of the first and second sacrificial stack 15, 20 has been exposed. The planarization of the interlevel dielectric layer 30 may also remove an upper surface of the at least one spacer 18. In some examples, following planarization, the upper surface of the semiconductor-containing material 16 is coplanar with an upper surface of the interlevel dielectric layer 30 and an upper surface of the at least one spacer 18.

Figure 4:
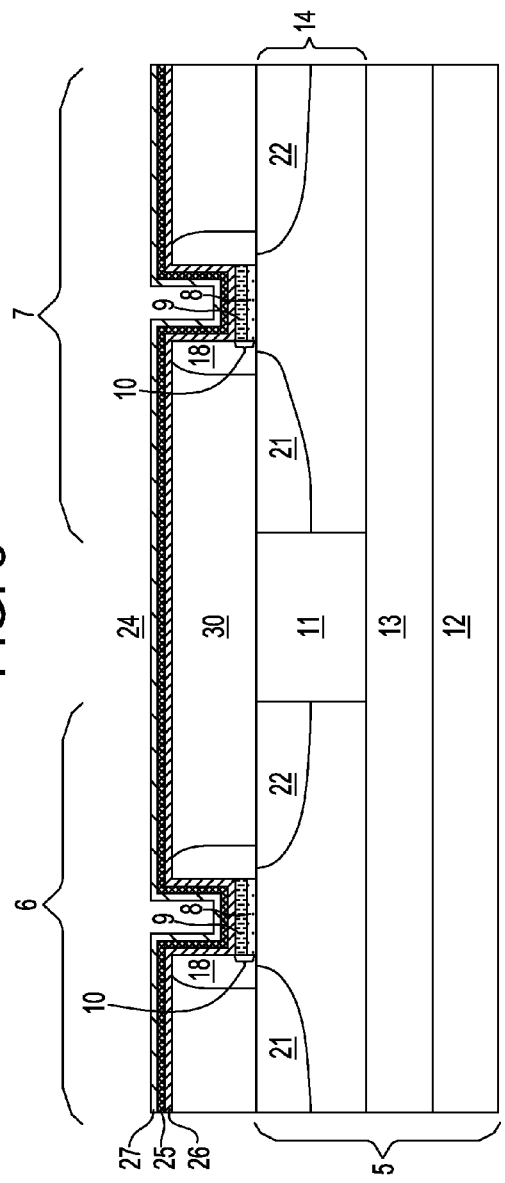
FIG. 4 is a side cross-sectional view depicting removing a portion of the first sacrificial stack and the second sacrificial stack to expose the gate dielectric layer, and forming a p-type work function metal layer on the gate dielectric layer, in accordance with one embodiment of the present invention.

FIG. 4 depicts one embodiment of removing a portion of the first sacrificial stack and the second sacrificial stack to expose the gate dielectric layer 10, and forming a p-type work function metal layer 25 on the gate dielectric layer 10. In embodiments in which the hard mask dielectric layer 17 is present following planarization of the interlevel dielectric layer 30, the hard mask dielectric layer 17 and the semiconductor-containing material 16 may be removed by an etch process that is selective to the gate dielectric layer 10. In one example, in which the hard mask dielectric layer 17 is removed by the planarization process that was applied to the interlevel dielectric layer 30, the semiconductor-containing material 16 may be removed using a wet or dry etch process, which is selective to the gate dielectric layer 10, e.g., the metal nitride gate dielectric layer 9 of the gate dielectric 10. For example, a semiconductor-containing layer 16 that is composed of polysilicon may be removed using bromide gas etch chemistries, i.e., HBr, having a high selectivity to a metal nitride gate dielectric layer 9 that is composed of TiN.

In one embodiment, the p-type work function metal layer 25 is conformally deposited in the first device region 6 and the second device region 7 of the semiconductor substrate 5, in which the p-type work function metal layer 25 is deposited over the gate dielectric layer 10 and the interlevel dielectric layer 30. As used herein, a "p-type work function metal layer 25" is a metal layer that effectuates a p-type threshold voltage shift. In one embodiment, the work function of the p-type work function metal layer 25 ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer 25 is composed of TiN. Other materials that are suitable for providing the p-type work function metal layer 25 include TaC, TaNC, Ru, and TiNi.

In one embodiment, forming the p-type work function metal layer 25 on the gate dielectric layer 10 in the first device region 6 and the gate dielectric layer 10 in the second device region 7 includes depositing an etch stop metal nitride layer 26 on the metal nitride gate dielectric layer 9 in the first device region 6 and the second device region 7. The p-type work function metal layer 25 is then deposited on the etch stop metal nitride layer 26 in the first device region 6 and the second device region 7. A thermal dielectric 27 may then be formed on the p-type work function metal layer 25 in the first device region 6 and the second device region 7.

In one embodiment, the etch stop metal nitride layer 26 is composed of TaN. Other materials that are suitable for the etch stop metal nitride layer 26 include WN, WSiN, TiN, TiSiN, TaSiN, TiTaN, TaRuN or combinations thereof. In one embodiment, the etch stop metal nitride layer 26 is deposited in direct contact with the TiN metal nitride gate dielectric layer 9 using chemical vapor deposition (CVD/p-CVD/ALD), sputtering or plating. In one example, a etch stop metal nitride layer 26 composed of TaN is sputtered from a solid tantalum target, in which the nitrogen content of the etch stop metal nitride layer 26 is introduced by a nitrogen gas. In another example, a etch stop metal nitride layer 26 composed of TaN is sputtered from a solid target comprised of tantalum and nitrogen. In one example, the etch stop metal nitride layer 26 has a thickness ranging from 1 nm to 10 nm. In another example, the etch stop metal nitride layer 26 has a thickness ranging from 2.5 nm to 5 nm.

The p-type work function metal layer 25 composed of TiN may be deposited in direct contact with the metal nitride etch stop layer 26 composed of TaN using chemical vapor deposition (CVD/p-CVD/ALD), sputtering or plating. In one example, a p-type work function metal layer 25 composed of TiN may be deposited using sputtering. The p-type work function metal layer 25 composed of TiN may be sputtered from a solid titanium target, in which the nitrogen content of the p-type work function metal layer 25 is introduced by a nitrogen gas. In another example, a p-type work function metal layer 25 composed of TiN is sputtered from a solid target comprised of titanium and nitrogen. In one example, the p-type work function metal layer 25 has a thickness ranging from 1 nm to 10 nm. In another example, the p-type work function metal layer 25 has a thickness ranging from 2.5 nm to 5 nm.

The thermal dielectric 27 may then be formed in direct contact with the p-type work function metal layer 25 using a thermal growth process. The thermal dielectric 27 may be composed of a thermally grown oxide, such as silicon oxide. In another embodiment, the thermal dielectric 27 may be composed of a thermally grown nitride, such as silicon oxynitride. The thickness of the thermal dielectric 27 typically ranges from 1 nm to 10 nm. In another embodiment, the thickness of the thermal dielectric 27 ranges from 2.5 nm to 5 nm.

Figure 5:
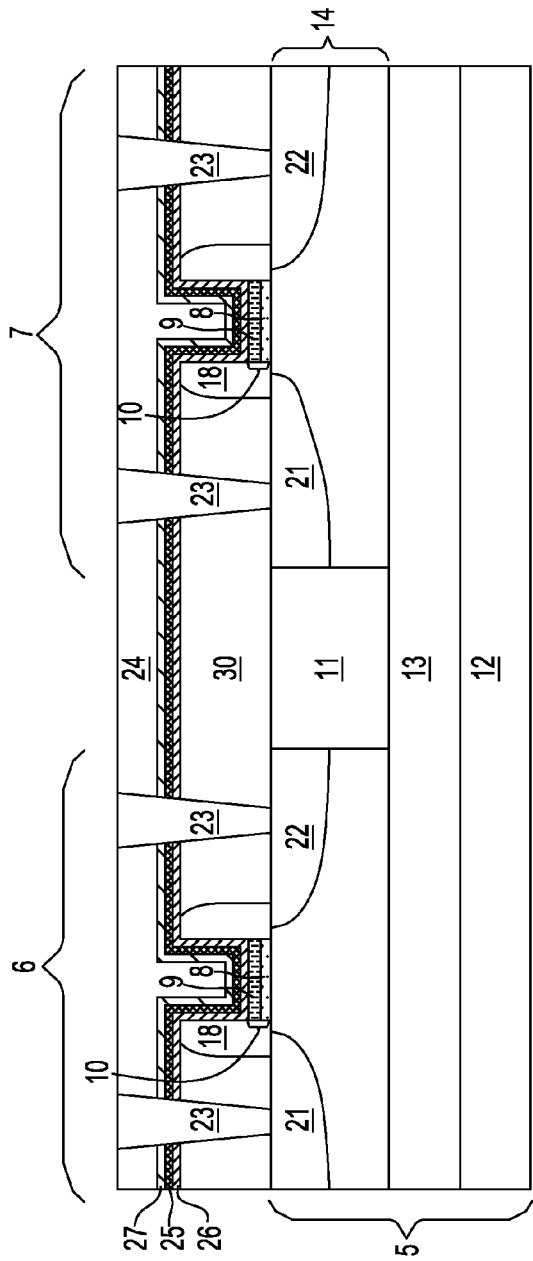
FIG. 5 is a side cross-sectional view depicting forming a via to each of the first source region, the first drain region, the second source region and the second drain region, in accordance with one embodiment of the present invention.

FIG. 5 depicts forming via 23 though the interlevel dielectric layer 30 to each of the source and drain regions 21, 22. The vias 23 are formed using deposition, photolithography and etch process steps. In one embodiment, a first block mask is formed using deposition and photolithography atop the interlevel dielectric layer 30, in which openings in the first block mask expose the areas in which the vias 23 are to be formed. For example, a layer of photoresist 24 is deposited atop the entire structure. The photoresist layer 24 may be comprised of dielectrics including carbon, oxygen, and various inorganic metals. The photoresist layer 24 may be selectively patterned and developed to form a first block mask, protecting at least one first region of the interlevel dielectric layer 30 and exposing at least one second region of the interlevel dielectric layer 30 in which the vias 23 are subsequently formed. The vias 23 are etched into the interlevel dielectric 30 using a selective etch process. In one embodiment, the vias 23 are etched using an anisotropic etch. An anisotropic etch process is a material removal process in which the etch rate in the direction normal to the surface to be etched is much higher than in the direction parallel to the surface to be etched. In one embodiment, the vias 23 are formed using reactive ion etching (RIE). Reactive ion etching (RIE) is a form of plasma etching that during etching the surface to be etched is placed on the RF powered electrode, wherein the surface to be etched takes on a potential that accelerates the etching species extracted from a plasma toward the surface, to be etched in which the chemical etching reaction is taking place in the direction normal to the surface.

In one embodiment, during via 23 formation a portion of the p-type work function metal layer 25 that is overlying the source region 21 and the drain region 22 is removed. More specifically, a selective etch process can be employed to remove the exposed portion of the interlevel dielectric 30 selective to the p-type work function metal layer 25. Thereafter, the p-type work function metal layer 25 may be removed selective to the interlevel dielectric 30. The interlevel dielectric 30 is then etched selectively to the upper surface of the source and drain regions 21, 22, e.g., the upper surface of the silicide contacts (not shown) that are formed atop the source and drain regions 21, 22. Following the formation of the vias 23, the photoresist 24 is removed using oxygen ashing, a chemical strip or selective etching.

Figure 6:
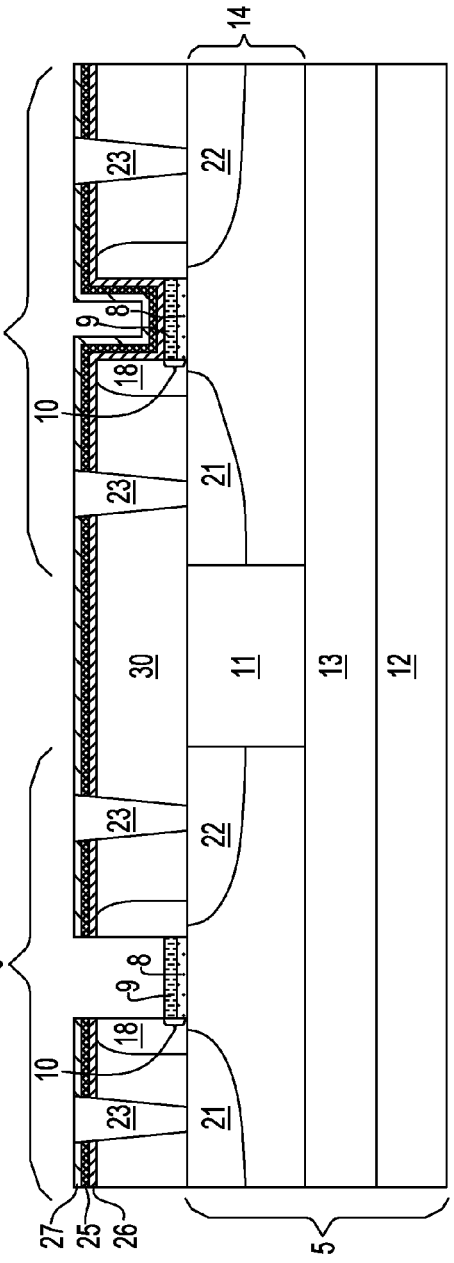
FIG. 6 is a side cross-sectional view depicting removing the p-type work function metal from the gate dielectric in the first device region, wherein the p-type work function metal remains in the second device region, in accordance with one embodiment of the present invention.

FIG. 6 depicts removing the p-type work function metal layer 25 from the gate dielectric 10 in the first device region 6, wherein the p-type work function metal layer 25 remains in the second device region 7. In one embodiment, removing the p-type work function metal layer 25 includes forming a second block mask (not shown) overlying at least the second device region 7. In one embodiment, the block mask is also formed over the p-type work function metal layer 25 that is present on an upper surface of the interlevel dielectric 30 in the first device region 6.

The second block mask may comprise soft and/or hard mask materials and can be formed using deposition, photolithography and etching. In one embodiment, the second block mask is composed of a photoresist. A second block mask can be produced by applying a photoresist layer to the surface of the semiconductor substrate 5, exposing the photoresist layer to a pattern of radiation, and then developing the pattern into the photoresist layer utilizing a resist developer.

In another embodiment, the second block mask can be a hard mask material. Hard mask materials include dielectric systems that may be deposited by chemical vapor deposition (CVD/ALD) and related methods. Typically, the hard mask composition includes silicon oxides, silicon carbides, silicon nitrides, and silicon carbonitrides, etc. Spin-on dielectrics may also be utilized as a hard mask material including, but not limited to: silsequioxanes, siloxanes, and boron phosphate silicate glass (BPSG). A second block mask comprising a hard mask material may be formed by blanket depositing a layer of hard mask material, providing a patterned photoresist atop the layer of hard mask material, and then etching the layer of hard mask material to provide a block mask protecting at least the second device region 7, wherein at least the portion of the p-type work function metal layer 25 overlying the gate dielectric 10 is exposed.

Following the formation of the second block mask, the p-type work function metal layer 25 is removed from the gate dielectric 10 in the first device region 6 by a selective etch process. More specifically, removing the p-type work function metal layer 25 begins with a first etch chemistry for removing the thermal dielectric layer 27 from the first device region 6 that is selective to the p-type work function metal layer 25. In some embodiments, the thermal dielectric layer 27 is removed from both the first and second device region 6, 7 prior to the formation of the second block mask. In a following process step, the p-type type work function metal layer 25 is etched selective to the gate dielectric 10, wherein the p-type work function metal layer 25 remains atop the gate dielectric 10 in the first device region 6. More specifically, the p-type work function metal layer 25 is etched selective to the metal nitride gate dielectric 9. In some embodiments, the p-type work function metal layer 25 is removed by an etch that is selective to the etch stop metal layer 26, wherein in a following process step the etch stop metal layer 26 may be removed by an etch that is selective to the metal nitride gate dielectric 9. During the etch processes that removes the p-type work function metal layer 25 from the first device region 6, the second device region 7 is protected by the second block mask. The p-type work function metal layer 25 may be removed using an anisotropic etch or an isotropic etch. The anisotropic etch may be provided by reactive ion etching or laser etching. The isotropic etch may be provided by a wet chemical etch.

In some embodiments, following removal of the p-type work function metal layer 25, the second block mask may be removed. In the embodiments, in which the second block mask is composed of a photoresist material, the second block mask may be removed using oxygen ashing or a chemical strip. In embodiments in which the second block mask is composed of a hard mask dielectric, the second block mask is removed using a selective etch process.

In some embodiments in which the thermal dielectric layer 27 is still present in the second device region 7 while the p-type work function metal layer 25 is removed from the first device region 6, the thermal dielectric layer 27 may be removed following the removal of the second block mask. The thermal dielectric layer 27 may be removed using an etch that is selective to at least the p-type work function metal layer 25 in the second device region 7 and the gate dielectric layer 10 in the first device region 6.

Figure 7:
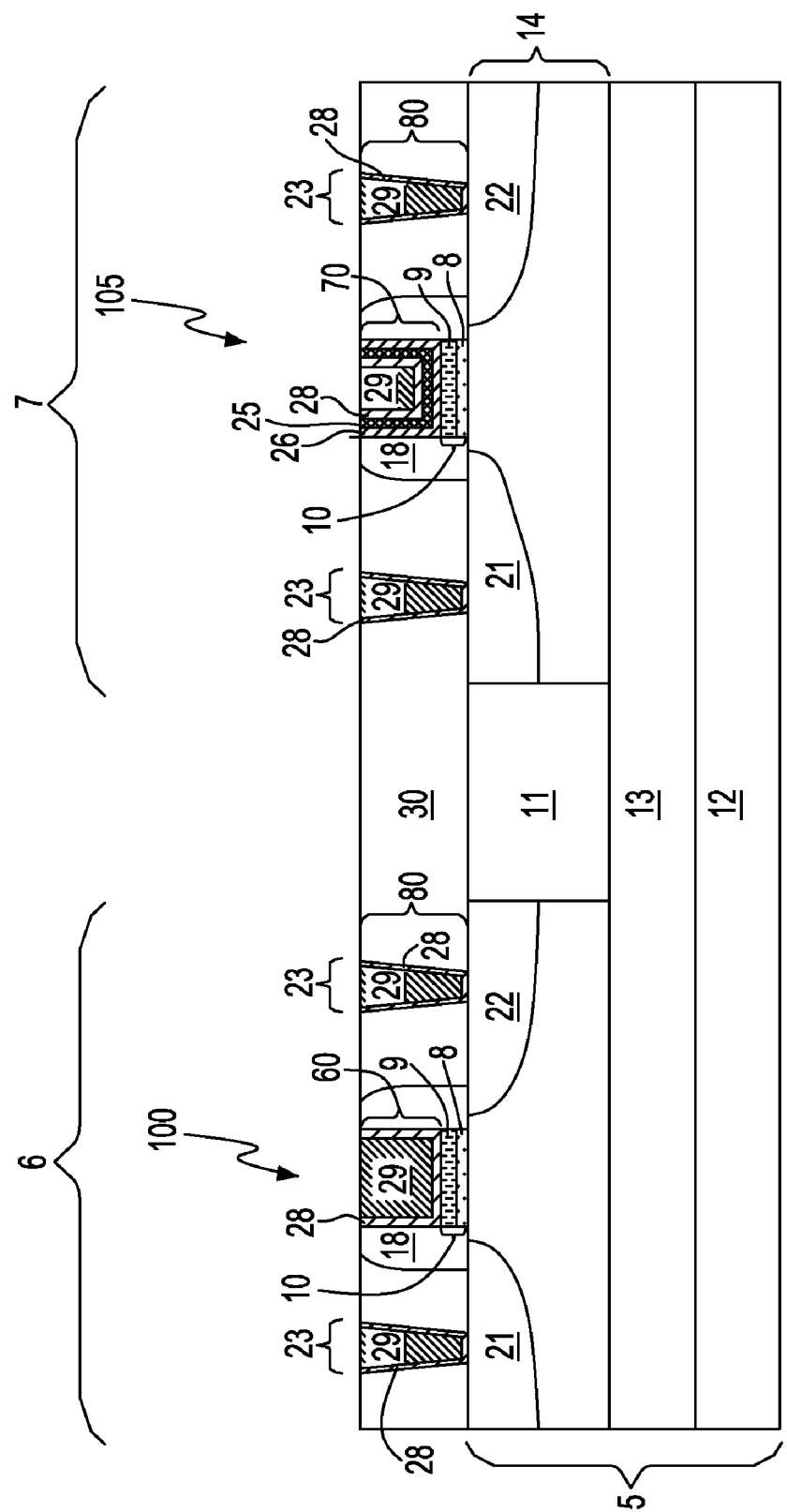
FIG. 7 is a side cross-sectional view depicting forming a metal layer composed of titanium and aluminum on the gate dielectric layer in the first device region, the first source region, the first drain region, the p-type work function metal in the second device region, the second source region and the second drain region, and forming a metal fill composed of aluminum on the metal layer that is composed of titanium and aluminum, in accordance with one embodiment of the present invention.

FIG. 7 depicts one embodiment of forming a metal layer 28 composed of titanium and aluminum in the first device region 6 and the second device region 7. In one embodiment, the metal layer 28 comprising titanium and aluminum is an n-type work function metal layer. In one embodiment, the work function of the n-type work function metal layer ranges from 4.1 eV to 4.3 eV. As used herein, a "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons.

In the first device region 6, the metal layer 28 composed of titanium and aluminum is deposited on the gate dielectric layer 10, the source region 21 and the drain region 22. More specifically, in one embodiment, the metal layer 28 composed of titanium and aluminum is deposited in direct contact with the metal nitride gate dielectric 9 of the gate dielectric layer 10. In the second device region 7, the metal layer 28 composed of titanium and aluminum is deposited in direct contact with the p-type work function metal layer 25 and is in direct contact with the source region 21 and the drain region 22.

In some examples, the metal layer 28 composed of titanium and aluminum is blanket deposited on the first device region 6 and the second device region 7, in which the titanium and aluminum containing metal layer 28 is present on the upper surface of the structure in the first device region 6 that is between the vias 23 to the source and drain regions 21, 22 and the gate dielectric 10. The metal layer 28 composed of titanium and aluminum may also be present on the sidewall of the vias 23 and the sidewall of the structure, e.g., interlevel dielectric 30, that is leading to the gate dielectric 10 in the first device region 6 and/or the p-type work function metal layer 25 in the second device region 7. The metal layer 28 composed of titanium and aluminum may have a thickness ranging from 1 nm to 20 nm. In another embodiment, the thickness of the metal layer 28 composed of titanium and aluminum ranges from 5 nm to 10 nm.

In one embodiment, the metal layer 28 comprising titanium and aluminum may be deposited by a physical vapor deposition (PVD) method, such as sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the metal layer 28 comprising titanium and aluminum include DC diode type systems, radio frequency (RF) sputtering, magnetron sputtering, and ionized metal plasma (IMP) sputtering. In addition to physical vapor deposition (PVD) techniques, the metal layer 28 comprising titanium and aluminum may also be formed using chemical vapor deposition (CVD) and atomic layer deposition (ALD).

In one embodiment, the metal layer 28 comprising titanium and aluminum may be composed of titanium aluminum nitride (TiAlN). In one example, the titanium content of the titanium aluminum nitride may range from 20 wt % to 80 wt %, the aluminum content of the titanium aluminum nitride may range from 20 wt % to 60 wt %, and the nitrogen content of the titanium aluminum nitride may range from 20 wt % to 60 wt %. In another example, the titanium content of the titanium aluminum nitride may range from 30 wt % to 60 wt %, the aluminum content of the titanium aluminum nitride may range from 25 wt % to 40 wt %, and the nitrogen content of the titanium aluminum nitride may range from 25 wt % to 50 wt %.

In one embodiment, a sputtering deposition process for depositing titanium aluminum nitride (TiAlN) includes applying high energy particles to strike a solid slab of a titanium aluminum alloy target material, in which the high energy particles physically dislodge atoms of titanium and aluminum to be deposited on the gate dielectric 10 in the first device region 6 and the p-type work function metal layer 25 in the second device region 7. In another embodiment, the sputtering apparatus may include dual targets, e.g., a first target composed of titanium and a second target composed of aluminum. The sputtered atoms of titanium and aluminum typically migrate through a vacuum and deposit on the deposition surface. In one example, the ion energies of the high-energy particles, e.g., positive ions from an argon gas flow discharge range from 500 eV to 5,000 eV. In another embodiment, the ion energies of the high-energy particles range from 1,500 eV to 4,500 eV.

The source of nitrogen for the titanium aluminum nitride (TiAlN) may be provided by nitrogen gas ($N_2$). The nitrogen source may be introduced to the sputtering chamber as the sputtered atoms of titanium and aluminum are migrating towards the deposition surface, e.g., the gate dielectric 10 in the first device region 6 and the p-type work function metal layer 25 in the second device region 7. In one example, the nitrogen source is provided by co-sputtering from a titanium (Ti) and an aluminum (Al) target in an $Ar/N_2$ gas mixture.

FIG. 7 further depicts forming a metal fill 29 comprising aluminum on the metal layer 28 comprising titanium and aluminum. In some embodiments, the metal fill 29 is formed in direct contact with the metal layer 28 comprising titanium and aluminum. In one embodiment, the metal fill 29 is composed of 99% aluminum. In another embodiment, the metal fill 29 is composed of 100% aluminum. The metal fill 29 is typically deposited by physical vapor deposition (PVD), such as sputtering. Examples of sputtering apparatus that may be suitable for depositing the metal fill 29 comprising aluminum includes DC diode type systems, radio frequency (RF) sputtering, magnetron sputtering, and ionized metal plasma (IMP) sputtering. In addition to physical vapor deposition (PVD) techniques, the metal fill 29 comprising titanium may also be formed using chemical vapor deposition (CVD) and atomic layer deposition (ALD).

In one embodiment, a sputtering deposition process for depositing the metal fill 29 that is composed of aluminum includes applying high energy particles to strike a solid slab of high-purity aluminum target material, in which the high energy particles physically dislodge atoms of the aluminum to be deposited on the gate dielectric layer 13. In one example, the ion energies of the high-energy particles, e.g., positive ions from an argon gas flow discharge, range from 500 eV to 5,000 eV. In another embodiment, the ion energies of the high-energy particles range from 1,500 eV to 4,500 eV. In one embodiment, by high-purity aluminum it is meant that the aluminum content of the target material is greater than 99.5%. In some embodiments, the aluminum content of the target material may be as great as 99.9% with a remainder of incidental impurities. "Incidental impurities" denote any contamination of the target, i.e., aluminum. Allowable ranges of impurities are less than 0.05 wt % for each impurity constituent, and 0.1 wt % for total impurity content. The sputtered aluminum atoms from the aluminum target may migrate through a vacuum and deposit on the deposition surface, e.g., the gate dielectric layer 13. In one example, iron (Fe), copper (Cu), and silver (Ag) may be present in less than 5 parts per million (ppm).

The metal fill comprising aluminum 29 may be planarized until an upper surface of the metal fill 29 is coplanar with an upper surface of the interlevel dielectric 30. In one example, the planarization process is provided by chemical mechanical planarization (CMP). Chemical Mechanical Planarization (CMP) is a material removal process using both chemical reactions and mechanical forces to remove material and planarize a surface. In one embodiment, the planarization process removes the portions of the p-type work function metal layer 25, the thermal dielectric layer 27 and the etch stop metal nitride layer 26 that is present on the upper surface of the interlevel dielectric 30.

The metal fill 29 comprising aluminum and the metal layer 28 comprising titanium and aluminum that are present in the vias 23 provide the interconnect to the source and drain regions 21, 22 of an n-type semiconductor device 100 and a p-type semiconductor device 105. The metal fill 29 comprising aluminum and the metal layer 28 comprising titanium and aluminum are also present in the gate structure 60 to the p-type semiconductor device 100 and the gate structure 70 to the p-type semiconductor device 105. The term "gate structure" means a structure used to control output current (i.e., flow of carriers in the channel) of a semiconducting device, e.g., memory device, through electrical or magnetic fields.

More specifically and in one embodiment, the above method provides an electrical device that includes an n-type semiconductor device 100 having a first gate structure 60 in a first device region 6 of a semiconductor substrate 5 that is between a source region 21 and a drain region 22. The first gate structure 60 includes a gate dielectric 10 that is present on the semiconductor substrate 5, a metal layer 28 composed of titanium and aluminum, and a metal fill 29 composed of aluminum. The above method further provides a p-type semiconductor device 105 that is present on the same semiconductor substrate 5 with the n-type semiconductor device 100. The p-type semiconductor device 105 includes a second gate structure 70 in the second device region 7 of the semiconductor substrate 5 that is between a source region 21 and a drain region 22. The second gate structure 70 includes a gate dielectric 10 that is present on the semiconductor substrate 5, a p-type work function metal layer 25, a metal layer 28 comprising titanium and aluminum, and a metal fill 29 comprised of aluminum 28.

In one embodiment, the metal layer 28 comprising titanium and aluminum that is present in the gate structure 60 of the n-type semiconductor device 100 functions as an n-type work function metal that effectuates an n-type threshold voltage shift in the n-type semiconductor device 100. The work function of the n-type work function metal typically ranges from 4.1 eV to 4.3 eV.

The second device region 7 includes a p-type work function metal layer 25 that is in direct contact with the gate dielectric 10 of the gate structure 70 to the p-type semiconductor device 105. The p-type work function metal layer 25 effectuates a threshold voltage shift in the n-type semiconductor device 105. In one example, the work function of the p-type work function metal typically ranges from 4.9 eV to 5.1 eV. The metal layer 28 comprising titanium and aluminum that is present in the gate structure 70 of the p-type semiconductor device 105 is separated from the gate dielectric 10 by the p-type work function metal layer 25.

In one embodiment, the metal layer 28 comprising titanium and aluminum that is present in the gate structure 70 of the p-type semiconductor device 105 is separated from the gate dielectric 10 by a dimension ranging from 1 nm to 10 nm. In another embodiment, the metal layer 28 comprising titanium and aluminum that is present in the gate structure 70 of the p-type semiconductor device 105 is separated from the gate dielectric 10 by a dimension ranging from 3 nm to 8 nm. As noted above, in some embodiments, the metal layer 28 comprising titanium and aluminum is an n-type work function metal. By separating the metal layer comprising titanium and aluminum 28 from the gate dielectric 10 of the p-type semiconductor device 105, the n-type threshold voltage shift that can result from the metal layer 28 comprising titanium and aluminum is substantially eliminated in the p-type semiconductor device 105.

Still referring to FIG. 7, an interlevel dielectric 30 is present over the semiconductor substrate 5 and at least a portion of the n-type and p-type semiconductor devices 100, 105. Interconnects 80 are present through the interlevel dielectric 30 to the source region 21 and drain region 22 in the first device region 6, and to the source region 21 and the drain region 22 in the second device region 7. Each of the interconnects 80 include the metal layer 28 that is composed of titanium and aluminum, and the metal fill 29 that is composed of aluminum. The interconnects 80 that are composed of the metal layer 28 comprised of titanium and aluminum and the metal fill 29 that is composed of aluminum do not require seed layers that are typically employed in conventional copper interconnect structures. Further, in some embodiments of the present method by forming the interconnects 80 with a metal layer 28 comprised of titanium and aluminum, and a metal fill 29 composed of aluminum, and by incorporating those materials into the gate structures 60, 70 of the n-type and p-type semiconductor devices 100, 105, the present structures and methods reduce process complexity and cost.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a semiconductor device comprising:
    forming a first sacrificial stack and a second sacrificial stack on a semiconductor substrate, the first sacrificial stack and the second sacrificial stack each including a gate dielectric layer, wherein the gate dielectric layer comprises a high-k dielectric layer that is deposited in direct contact with the semiconductor substrate, and a metal nitride gate dielectric layer that is deposited directly on an upper surface of the high-k dielectric layer, wherein the first sacrificial stack is present in a first device region of the semiconductor substrate between an n-type source region and an n-type drain region, and the second sacrificial stack is present in a second device region of the semiconductor substrate between a p-type source region and a p-type drain region;
    forming an interlevel dielectric having an upper surface that is coplanar with an upper surface of the first sacrificial stack and the second sacrificial stack;
    removing an portion of the first sacrificial stack and the second sacrificial stack to expose the gate dielectric layer;
    forming a p-type work function metal layer on the gate dielectric layer, wherein the forming of the p-type work function metal layer comprises depositing an etch stop metal nitride layer on the metal nitride gate dielectric layer in the first device region and the second device region; depositing the p-type work function metal layer on the etch stop metal nitride layer in the first device region and the second device region, and forming a thermal dielectric on the p-type work function metal layer in the first device region and the second device region;
    forming a via to each of the n-type source region, the n-type drain region, the p-type source region and the p-type drain region;
    removing the p-type work function metal layer from the first device region, wherein the p-type work function metal layer remains in the second device region;
    forming a metal layer comprising titanium and aluminum on the gate dielectric layer in the first device region, the n-type source region, the n-type drain region, the p-type work function metal layer in the second device region, the p-type source region and the p-type drain region; and
    forming a metal fill comprising aluminum on the metal layer comprising titanium and aluminum.

2. The method of claim 1, wherein the first sacrificial stack and the second sacrificial stack further comprise a semiconductor-containing material that is present on the gate dielectric layer and a hard mask dielectric layer that is present on the semiconductor containing-material.

3. The method of claim 2, wherein forming the first sacrificial stack and the second sacrificial stack further comprises:
    forming a patterned etch mask atop the hard mask dielectric layer; and
    etching the hard mask dielectric layer, the semiconductor-containing material and the gate dielectric layer to form the first sacrificial stack and the second sacrificial stack.

4. The method of claim 1, wherein forming the p-type source region, the p-type drain region, the n-type source region, and the n-type drain region comprises:
    forming a spacer on a sidewall of the first sacrificial stack and the second sacrificial stack; and
    implanting dopants into the semiconductor substrate.

5. The method of claim 4, wherein the forming of the interlevel dielectric having the upper surface that is coplanar with the upper surface of the first sacrificial stack and the second sacrificial stack comprises:
    depositing the interlevel dielectric over the semiconductor substrate, the first sacrificial stack and the second sacrificial stack; and planarizing the upper surface of the interlevel dielectric until the interlevel dielectric is removed from the upper surface of the first sacrificial stack and the second sacrificial stack.

6. The method of claim 2, wherein the removing of the portion of the first sacrificial stack and the second sacrificial stack to expose the gate dielectric layer in each of the first device region and the second device region comprises:
   etching the hard mask dielectric layer selective to the semiconductor-containing; and
   etching the semiconductor containing-material selective to the gate dielectric layer.

7. The method of claim 1, wherein the forming the via comprises:
   forming a first etch mask atop the interlevel dielectric; and
   etching the interlevel dielectric layer with an anisotropic etch.

8. The method of claim 1, wherein the removing of the a p-type work function metal layer from the first device region comprises:
   forming a second etch mask overlying the second device region; and
   etching the p-type work function metal layer selective to the gate dielectric layer in the first device region.

9. The method of claim 1, wherein the removing of the at least the portion of the p-type work function metal layer from the first device region comprises:
   forming a second etch mask overlying the second device region;
   etching the thermal dielectric selective to the p-type work function metal layer; and
   etching the p-type work function metal layer selective to the etch stop metal nitride layer, wherein the p-type work function metal layer remains atop the metal nitride gate dielectric layer in the second device region.

10. The method of claim 1, wherein the forming of the metal layer comprising titanium and aluminum on the gate dielectric in the first device region, the n-type source region, the n-type drain region, the p-type work function metal layer in the second device region, the p-type source region and the p-type drain region comprises:
    removing the thermal dielectric from the p-type work function metal layer in the first device region;
    removing the etch stop metal nitride layer that is the first device region after the p-type work function metal layer is removed from the first device region; and
    depositing the metal layer comprising titanium and aluminum in direct contact with the p-type work function metal layer that is in the first device region in direct contact with metal nitride gate dielectric layer in the first device region, and in contact with the n-type source region, the n-type drain region, the p-type work function metal layer in the second device region, the p-type source region, and the p-type drain region.

11. The method of claim 10 further comprising planarizing the metal fill comprising aluminum until an upper surface of the metal fill comprising aluminum is coplanar with an upper surface of the interlevel dielectric.

12. The method of claim 10, wherein the metal nitride gate dielectric layer is comprised of TiN and the metal nitride etch stop layer is comprised of TaN.

* * * * *